United States Patent
Nguyen

(10) Patent No.: US 7,361,387 B2
(45) Date of Patent: Apr. 22, 2008

(54) PLASMA ENHANCED PULSED LAYER DEPOSITION

(75) Inventor: Tue Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 10/744,889

(22) Filed: Dec. 23, 2003

(65) Prior Publication Data

US 2004/0137167 A1    Jul. 15, 2004

Related U.S. Application Data

(62) Division of application No. 09/721,162, filed on Nov. 22, 2000, now Pat. No. 6,689,220.

(51) Int. Cl.
*H05H 1/46* (2006.01)
*B05D 3/06* (2006.01)
*C23C 16/02* (2006.01)
*C23C 16/44* (2006.01)
*C23C 16/50* (2006.01)
*C23C 16/511* (2006.01)
*C23C 16/56* (2006.01)

(52) U.S. Cl. .............. 427/569; 427/575; 427/571; 427/535; 427/576

(58) Field of Classification Search .............. 427/488, 427/534, 535, 562, 569, 573; 438/788, 792, 438/771, 772, 776, 777, 761
See application file for complete search history.

(56) References Cited

U.S. PATENT DOCUMENTS

| | | | |
|---|---|---|---|
| 5,017,404 A * | 5/1991 | Paquet et al. ............... 427/573 |
| 5,318,806 A * | 6/1994 | Montgomery et al. ...... 427/491 |
| 5,399,388 A * | 3/1995 | Aklufi ......................... 427/575 |
| 5,480,818 A * | 1/1996 | Matsumoto et al. ........ 438/150 |
| 5,514,603 A | 5/1996 | Sato |
| 5,576,071 A * | 11/1996 | Sandhu ........................ 427/534 |
| 5,643,638 A * | 7/1997 | Otto et al. ................... 427/569 |
| 5,913,144 A * | 6/1999 | Nguyen et al. .............. 438/643 |
| 5,916,365 A * | 6/1999 | Sherman ....................... 117/92 |
| 5,928,528 A | 7/1999 | Kubota et al. |
| 5,983,828 A | 11/1999 | Savas |
| 6,070,551 A | 6/2000 | Li et al. |
| 6,132,552 A | 10/2000 | Donohoe et al. |
| 6,268,288 B1 * | 7/2001 | Hautala et al. .............. 438/680 |
| 6,305,314 B1 * | 10/2001 | Sneh et al. ............. 118/723 R |
| 6,342,277 B1 * | 1/2002 | Sherman ...................... 427/562 |
| 6,436,819 B1 * | 8/2002 | Zhang et al. ................ 438/656 |
| 6,689,220 B1 | 2/2004 | Nguyen |
| 6,730,614 B1 * | 5/2004 | Lim et al. .................... 438/763 |
| 2002/0076508 A1 * | 6/2002 | Chiang et al. .............. 427/569 |
| 2002/0160125 A1 * | 10/2002 | Johnson et al. ............. 427/569 |
| 2002/0197402 A1 * | 12/2002 | Chiang et al. ........... 427/255.39 |
| 2003/0143328 A1 * | 7/2003 | Chen et al. ............ 427/255.28 |

\* cited by examiner

*Primary Examiner*—Marianne Padgett
(74) *Attorney, Agent, or Firm*—Fliesler Meyer LLP

(57) ABSTRACT

A process system and a deposition method for depositing a highly controlled layered film on a workpiece is disclosed. The basic component of the apparatus is a pulsing plasma source that is capable of either exciting or not-exciting a first precursor. The pulsing plasma source includes an energy source to generate a plasma, and a plasma adjusting system to cause the plasma to either excite or not-excite a precursor. The precursor could flow continuously (an aspect totally new to ALD), or intermittently (or pulsing, standard ALD operation process). The deposition method includes the steps of pulsing the plasma to excite/not-excite the precursors and the ambient to deposit and modify the deposited layers. This procedure then can be repeated until the film reaches the desired thickness.

12 Claims, 15 Drawing Sheets

|  | step a | step b |
|---|---|---|
| gas 1 | not excited | excited |
|  |  |  |
| gas 2 | not excited | not excited |
|  |  |  |
| gas 3 | excited | excited |
|  |  |  |
| plasma | off | on |

Fig. 4

|         | step a            | step b         | step c       | step d       |
|---------|-------------------|----------------|--------------|--------------|
| gas 1   | flow not excited  | flow excited   | not flow     | not flow     |
| ambient | not excited       |                | not excited  | excited      |
| plasma  | off               | on             | off          | on           |

Fig. 5

PLASMA ENHANCED PULSED LAYER DEPOSITION

This application is a divisional of Ser. No. 09/721,162, filed Nov. 22, 2000, now U.S. Pat. No. 6,689,220.

FIELD OF THE INVENTION

The present invention relates generally to an apparatus for processing of semiconductor wafers, and more particularly to a system and method for deposition of thin films.

BACKGROUND OF THE INVENTION

A fundamental process in IC fabrication is chemical vapor deposition (CVD), which uses vapor precursors to deposit thin films on a semiconductor substrate. The reactor used for CVD processes includes a precursor delivery system, a substrate and an energy source to decompose the precursor vapor to reactive species to allow a thin film to form on the substrate (CVD process). Effective power sources are heat and plasma energy such as radio frequency (RF) power, microwave energy (MW), low frequency (10 KHz-1 MHz) power, and optical energy (e.g. a laser or ultraviolet light) which decompose the introduced precursors. Plasma energy power is below 6000W. The amount of power required in each process is determined by the process reaction and a typical power level is between 500-1000W. Also, the substrate could be biased or heated (to 100° C.-1200° C.) to promote the reaction of the decomposed atoms or molecules and to control the physical properties of the formed films.

Traditionally, precursors used in semiconductor CVD processes are gaseous. An example of a CVD process to deposit silicon dioxide ($SiO_2$) is to use gaseous precursors such as silane gas ($SiH_4$) and oxygen gas ($O_2$):

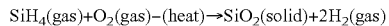

$SiH_4(gas) + O_2(gas) - (heat) \rightarrow SiO_2(solid) + 2H_2(gas)$

The basic requirements of a precursor are that the desired product (in this example, $SiO_2$) is solid and that all of the other products are gases (in this example, $H_2$) which can be exhausted away. The energy required for the reaction to take place is the thermal energy which is about 400-800° C.

To broaden the processes, more and more liquid and solid precursors have been used, especially in the area of metal-organic chemical vapor deposition (MOCVD). To perform this task, a liquid precursor is typically first turned into vapor which decomposes and reacts on the substrate. A solid precursor must often be dissolved into a solvent to form a liquid precursor. The liquid precursor then must be converted into the vapor phase before being introduced into the deposition zone. An example of a CVD process to deposit copper (Cu) uses liquid precursor vapor copper HexaFluoroACetylacetone TriMethylVinylSilane (hfac-copper-tmvs, $C_5HO_2F_6$—Cu—$C_5H_{12}Si$):

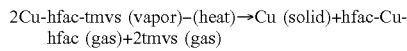

2Cu-hfac-tmvs (vapor)–(heat)→Cu (solid)+hfac-Cu-hfac (gas)+2tmvs (gas)

Another deposition technique is the atomic layer epitaxy (ALE) process. In ALE, the precursors are pulsed sequentially into the ALE process chamber. Each precursor sequentially generates a chemical surface reaction at the substrate surface to grow about an atomic layer of the material on the surface. The growth of one atomic layer in ALE is controlled by a saturating surface reaction between the substrate and each of the precursors. Sometimes a reduction sequence activated with extra energy such as heat or photon is used to re-establish the surface for a new atomic layer. The fundamental criterion of ALE is to have a minimum of two different chemical reactions at the surface with each reaction being carefully controlled to generate only one atomic layer. An example of ALE is the growth of ZnS at ~470° C. using sequential flow of elemental zinc and sulfur as precursors as disclosed in U.S. Pat. No. 4,058,430 to Suntola et al. Another example of ALE is the growth of germanium (Ge) on a silicon substrate at ~260-270° C. by first pulsing $GeH_4$ vapor to generate an atomic cover layer of $GeH_4$ and pulsing Xe lamp radiation to decompose the surface $GeH_4$ as disclosed by Sakuraba et al, J. Cryst. Growth, 115(1-4) (1991) page 79.

The ALE process is a special case of atomic layer deposition (ALD). The focus of ALE is the deposition of epitaxial layers, which means forming perfect crystal structures. In contrast, the ALD process seeks to deposit one layer at a time with the focus on forming film uniformity, and not on creating single crystal structures.

The major drawbacks of CVD and ALD processes are the high temperatures needed for the chemical reactions and the limited number of available precursors. CVD and ALD processes always start with an extensive evaluation of various potential precursors and their chemical reactions to determine see if there is a suitable process reaction.

To lower the temperature needed for the chemical reaction, and to further promote possible reactions, plasma energy can be used to excite the precursors before the reaction takes place in CVD processes. Such processes are called plasma enhanced CVD (PECVD). An energy source using radio frequency (RF) power or microwave (MV) power can be used to generate a plasma, which is a mixture of excited gaseous species, to supply energy to the precursors to promote chemical reactions.

However, there is no plasma enhanced ALD process or equipment. The main advantages of a plasma enhanced ALD would be the low temperatures required for the reactions to occur, and the increased number of precursors made available by the addition of plasma energy to excite the precursors. Furthermore, plasma treatment could modify the surface condition which also leads to a wider range of available precursors.

It would be advantageous to develop a plasma enhanced ALD system.

It would be advantageous if plasma treatment could be incorporated in an ALD process.

SUMMARY OF THE INVENTION

Accordingly, a plasma enhanced atomic layer deposition (PEALD) apparatus that offers atomic layer deposition capabilities using a plasma source to excite precursors is provided. In addition to the prior art surface reactions using non plasma-excited precursor, the present invention also offers surface reactions using plasma-excited precursors. With plasma-excited precursors, the surface reaction could cause either a deposition reaction or a material modification by plasma bombardment.

The basic component of the present invention apparatus is a pulsing plasma source that is capable of either exciting or not-exciting a first precursor. The pulsing plasma source includes an energy source that generates a plasma, and a plasma adjusting system that causes the plasma to either excite or not-excite a precursor. The precursor could flow continuously (an aspect totally new to ALD), or intermittently (or pulsing, which is a standard ALD operation process).

The plasma power source is preferably an inductive coupled plasma (ICP) source, but any plasma source, such as a capacitance plasma source, microwave guide plasma source, electron cyclotron resonance plasma source, magnetron plasma source, DC power plasma source, etc., works equally well.

In the simplest design, the plasma adjusting system is a power switch, that causes the plasma to be either ON or OFF. When the plasma is OFF, the precursor is not excited by the plasma because there is no plasma. When the plasma is ON, the precursor is excited by the plasma. Typical plasma power when ON is between 15 to 6000W. The low power is used for sensitive precursors such as those containing organic components. The timing for this design is long, in the order of many seconds, because of the time needed for the plasma to stabilize.

To shorten the plasma stabilizing time, the plasma adjusting system comprises a two-level plasma power switch: a low power first level and a high power second level. The first level plasma power generates a plasma that does not excite the precursor, either because the power is low enough or the precursor is far away from the plasma. The second level plasma power generates a large enough plasma to excite the precursor. By using the first level plasma, the stabilizing time is much shorter because the plasma is already present, and powering up from the first level to the second level power takes shorter time. The first power level is typically from 15 to 300W and the second power level is from 100 to 6000W.

Another way to block the plasma is to apply an electric field. The plasma adjusting system then comprises an electrode that has a potential. By varying the potential, the plasma could either pass through or be confined. At ground potential, the electrode will terminate the plasma which allows no plasma to pass through. At a positive potential, the electrode will repel all positive charges in the plasma field which allows only negative charges such as electrons to pass through. At a floating potential, which means that the electrode is not connected, the electrode will obtain a self-potential but the plasma will pass through. The electrode could be the workpiece support or a wire mesh above the workpiece.

The present invention apparatus further comprises a heater source to raise the workpiece to a process temperature.

The present invention apparatus further comprises a second precursor that is positioned in a way such that it is always not excited by the plasma, and a third precursor that is positioned in a way such that it is always excited by the plasma. These precursors complement the pulsing action of the plasma source on the first precursor for developing a wider selection of process conditions.

The present invention apparatus further comprises pulsing systems for the first, second and third precursors. The pulsing systems further allow the sequential deposition of these precursors. Together with the pulsed plasma, using the pulsed precursors offer more control of the timing of the process. The first, second and third precursors could comprise a plurality of precursors with different pulsing systems. As such, the precursors could pulsed together at the same time, pulsed at different times, or pulsed in a synchronized fashion such that when one of the pulsed precursors is on, the others are off.

The present invention further provides a method to deposit atomic layer using plasma enhanced ALD system. The method comprises the steps of:

(a) the plasma does not excite the first precursor; and (b) the plasma does excite the first precursor flow;

with the stepping sequence being interchangeable, meaning that either step (a) before step (b) or step (b) before step (a). This procedure can then be repeated alternately until the film reaches the desired thickness.

Generally, step (a) deposits a layer of material from the un-excited precursor to the workpiece surface. Step (b) could deposit a different layer from the excited precursor to the workpiece surface, or step (b) could modify the previously deposited layer with the excited precursor. Therefore, with (b) deposition, the method grows a thin film on a substrate by:

(a) subjecting the substrate to the vapor of the un-excited precursor to form a layer of material on the substrate; and (b) subjecting the thus-formed surface to the vapor of the excited precursor to form a different layer of material on the thus-formed surface.

With the step (b) modification, the method grows a thin film by:

(a) subjecting the substrate to the vapor of the un-excited precursor to form a layer of material on the substrate; and (b) subjecting the thus-formed surface to the vapor of the excited precursor to modify the material of the deposited layer on the thus-formed surface.

The present invention method also provides for the presence of a second precursor that is always not-excited and a third precursor that is always excited. Steps (a) and (b) then have the second and third precursors together with the first precursor. The addition of the second and the third precursors broadens the process parameters, which allows for the development of many advanced processes.

The precursor flows in steps (a) and (b) above can be continuous or intermittent (pulsing). An example of continuous precursor flow is TetraDiMethylAminoTitanium (TDMAT) in a process used to produce TiN film. With a low enough substrate temperature, TDMAT precursor does not react at the substrate. With the plasma on, TDMAT is decomposed and forms a thin TiN layer. With a pulsing plasma, a highly controlled layered TiN film is formed. Adding a continuous flow of a non-excited second precursor such as nitrogen gas, for example, could reduce the TDMAT partial pressure for controlling the deposition rate. Adding a continuous flow of a third plasma-excited precursor, such as nitrogen and hydrogen, for example, could change the film composition such as by reducing the amount of carbon.

The first, second and third precursors could each comprise a plurality of precursors. With pulsing precursors, which means that the precursor flow is either on or off, using a plurality of precursors offers sequential flow. For example, the first of the first precursors could flow, and then stop, then the second of the first precursors could flow, and then stop, and so on, until the last of the first precursors, before returning to the first of the first precursors.

Also, with pulsing precursors, a method in accordance with the present invention includes two more steps:

(c) when the precursor flow is off, the plasma does not excite the process chamber ambient residue enough to have an effect on the workpiece; and (d) when the precursor flow is off, the plasma does excite the process chamber ambient residue enough to have an effect on the workpiece, with the stepping sequence being interchangeable, which means that either step (c) before step (d) or step (d) before step (c). The stepping sequence between step (a), step (b), step (c) and step (d) is also interchangeable depending on the process development. The difference between steps (c), (d) and steps (a), (b) is the absence of the precursor flow. Steps (a), (b) occur when there is a precursor flow and steps (c, d) occur when there is no precursor flow. Without precursor flow, the ambient still has enough residual gaseous particles to sustain a plasma. This plasma, though without active precursor, still has enough energy to have an effect on the deposited film. With four steps, there are 4×3×2×1=24 possible sequences. This procedure can then be repeated alternately until the film reaches the desired thickness.

An example is the sequence: a c (a c a c . . . ). This is the prior art ALD process where one of the first precursors flows without being excited by the plasma to form a layer on the workpiece, and then stops, then another of the first precursors flows without being excited by the plasma to form another layer on the previous layer, and then stops, and the sequence continues until the film reaches the desired thickness. A variation of this example is the sequence b c (b c b c . . . ). In this sequence, one of the first precursors flows while being excited by the plasma to form a layer on the workpiece, and then stops, then another of the first precursors flows while being excited by the plasma to form another layer on the previous layer or to modify the material of the previous layer, and then stops, and the sequence continues. A specific example of this sequence is the use of TetraDiMethylAminoTitanium (TDMAT) in a process to produce TiN film. With the plasma on, TDMAT decomposes and forms a thin TiN layer (step b), then stops (step c). Then plasma-excited nitrogen and hydrogen flow modifies this thin TiN layer (step b) and then stop (step c). The sequence continues until the film reaches the desired thickness. A variation of this combination is the sequence b c a c (b c a c . . . ).

Another example is the combination of the first two example a c b c (a c b c . . . ). In this sequence, one of the first precursors flows without being excited by the plasma to form a layer on the workpiece, and then stops, then another of the first precursors flows while being excited by the plasma to form another layer on the previous layer or to modify the material of the previous layer, and then stops, and the sequence continues. A specific example of this sequence is TetraDiMethylAminoTitanium (TDMAT) in a process used to produce, TiN film. With plasma off, TDMAT is not quite decomposed and a thin layer of TDMAT coats the substrate (step a), then stops (step c). Then plasma-excited nitrogen and hydrogen flow to modify this thin TDMAT layer (step b) and then stop (step c). The sequence continues until the film reaches a desired thickness. A variation of this combination is the sequence b c a c (b c a c . . . ).

Another example is the sequences: b c d c (b c d c . . . ). In this sequence, one of the first precursors flows while being excited by the plasma to form a layer on the workpiece, and then stops, then the ambient is excited by the plasma to modify the newly deposited layer, and then stops, and the sequence continues. A specific example of this sequence is the use of TetraDiMethylAminoTitanium (TDMAT) in a process to produce TiN film. With plasma on, TDMAT decomposes and forms a thin TiN layer (step b), then stops (step c). Then plasma-excited nitrogen and hydrogen flow modifies this thin TiN layer (step b) and then stops (step c). Then the plasma-excited ambient also modifies this thin TiN layer (step d) and then stops (step c). The sequence continues until the film reaches the desired thickness. A variation of this example is the sequence: a c d c (a c d c . . . ). In this sequence, one of the first precursors flows without being excited by the plasma to form a layer on the workpiece, and then stops, then the ambient is excited by the plasma to modify the newly deposited layer, and then stops, and the sequence continues.

Another example is the sequence: a b c (a b c . . . ). In this sequence, one of the first precursors flows without being excited by the plasma to form a layer on the workpiece, then this precursor flows while being excited by the plasma to form another layer on the workpiece or to modify the material of the previous layer, and then stops. A variation of this sequence is: a b d c (a b d c . . . ). In this sequence, the ambient being is excited by the plasma to modify the newly deposited layer before stopping.

Another example is the sequencel: b a c (b a c . . . ). In this sequence, one of the first precursors flows while being excited by the plasma to form a layer on the workpiece, then this precursor flows without being excited by the plasma to form another layer on the workpiece or to modify the material of the previous layer, and then stops. A variation of this sequence is: d b a c (d b a c . . . ). In this sequence, the ambient is excited by the plasma to clean the surface before the precursor flows.

Although a few of the sequences for practicing the method of the invention have been disclosed, it will be appreciated that there are many more sequences and further modifications and variations thereto that may be made while keeping within the scope of the invention as defined in the appended claims.

BRIEF DESCRIPTION OF THE DRAWINGS

FIG. 4 shows the characteristic table of step a and step b of the present invention method of deposition.

FIG. 5 shows the characteristic table of step a, step b, step c, and step d of another embodiment of the present invention method of deposition.

FIG. 6 shows the deposited layers of step a.

DETAIL DESCRIPTION OF THE PREFERRED EMBODIMENTS

Figure 1:
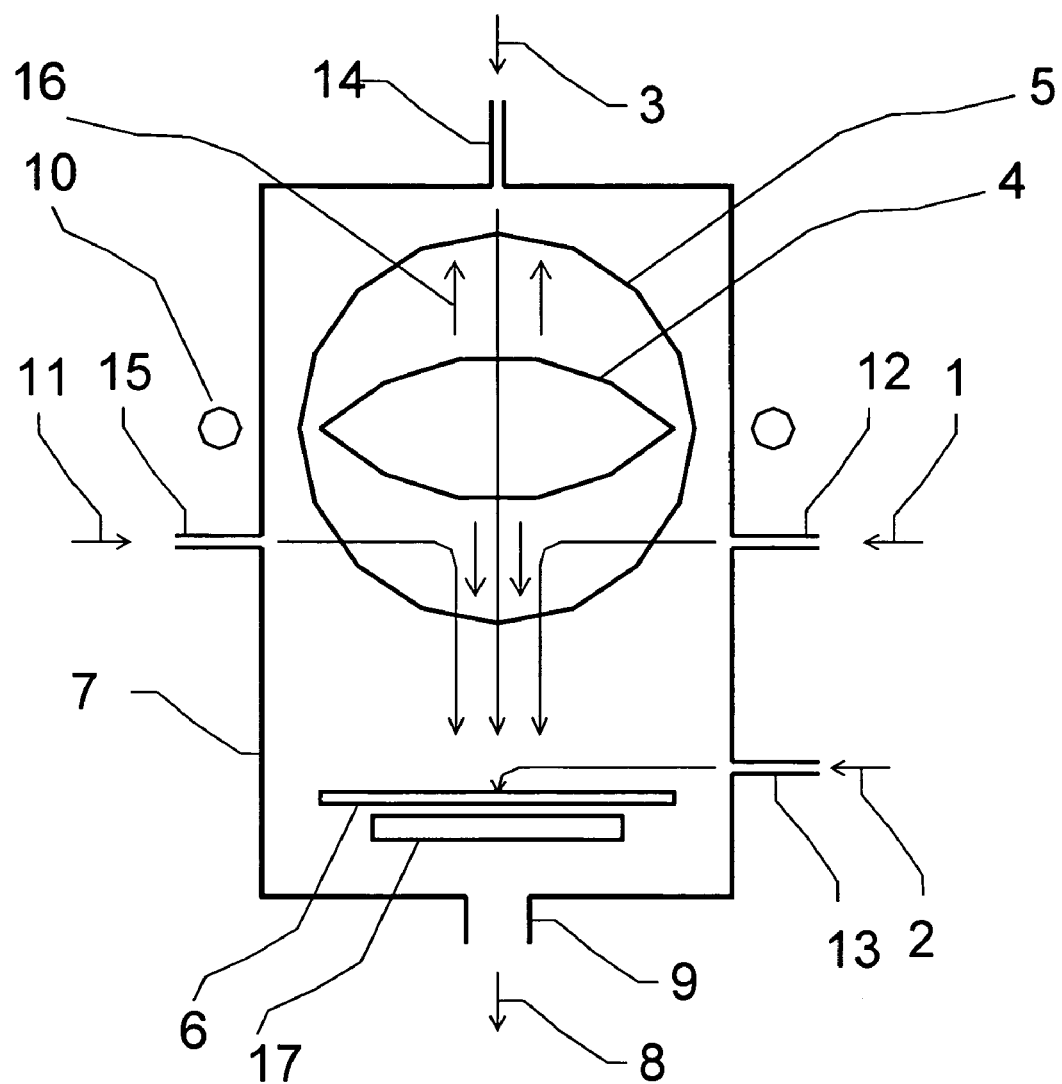
FIG. 1 shows the present invention plasma enhanced atomic layer deposition system.

FIG. 1 shows the present invention plasma enhanced atomic layer deposition system. The system includes a process chamber 7 with a workpiece 6 for deposition of layered films. Heater 17 controls the temperature of the workpiece 6 at the process temperature. An energy source 10 generates a plasma inside the process chamber 7. The plasma has two stages: 4 and 5, which are controlled by a plasma adjusting system (not shown) to increase the plasma from position 4 to position 5 (via direction 16) and vice versa. The plasma adjusting system in FIG. 1 controls the plasma power, with plasma 4 containing less power than plasma 5. By increasing the plasma power, more gas ionizes and the plasma volume increases. The process chamber includes two first precursor inlets 12 and 15 having precursor flows 1 and 11, respectively. The first precursors inlets and the plasma source are positioned in such a way that plasma 4 does not excite the precursors 1 and 11. With plasma 5, the precursors 1 and 11 are excited, thus the system uses plasma pulsing to pulse the energy of the precursors 1 and 11. The system further includes a second precursor inlet 13 having precursor flow 2. This precursor 2 is not excited by the plasma because of its position beneath the plasma area. The system further includes a third precursor inlet 14 having precursor flow 3. This precursor 3 is always excited by the plasma because it always passes through the plasma area. An exhaust 9 maintains an exhaust flow 8 to keep the chamber at the desired pressure.

Figure 2:
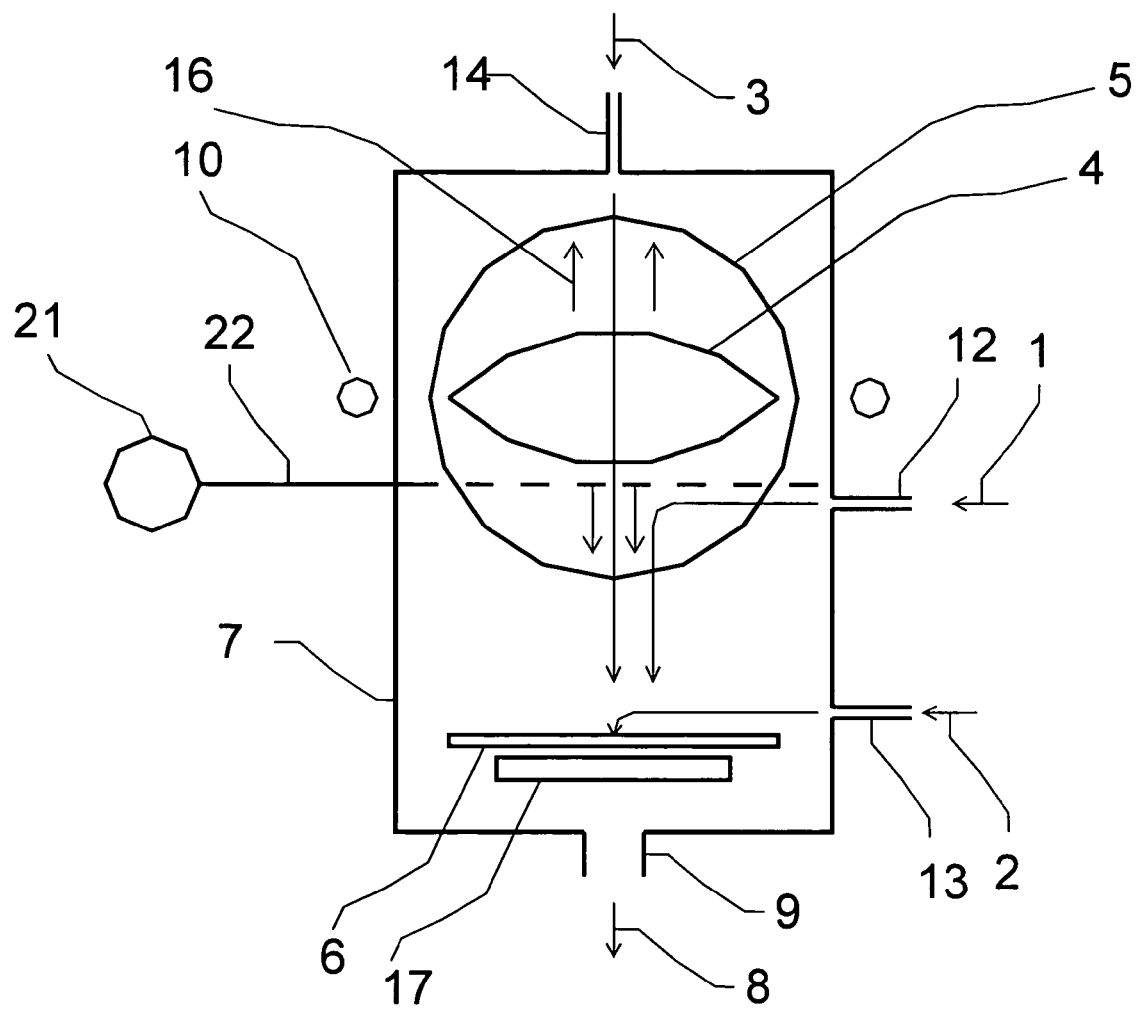
FIG. 2 shows another embodiment of the present invention plasma enhanced atomic layer deposition system.

FIG. 2 shows another embodiment of the present invention plasma enhanced atomic layer deposition system. This system uses an electrode 22 that is controlled by a voltage source 21 to adjust the plasma. By grounding the electrode 22, the plasma terminates at this electrode 22. By allowing the electrode 22 to float, the plasma ignores this electrode and resumes a large area.

Figure 3:
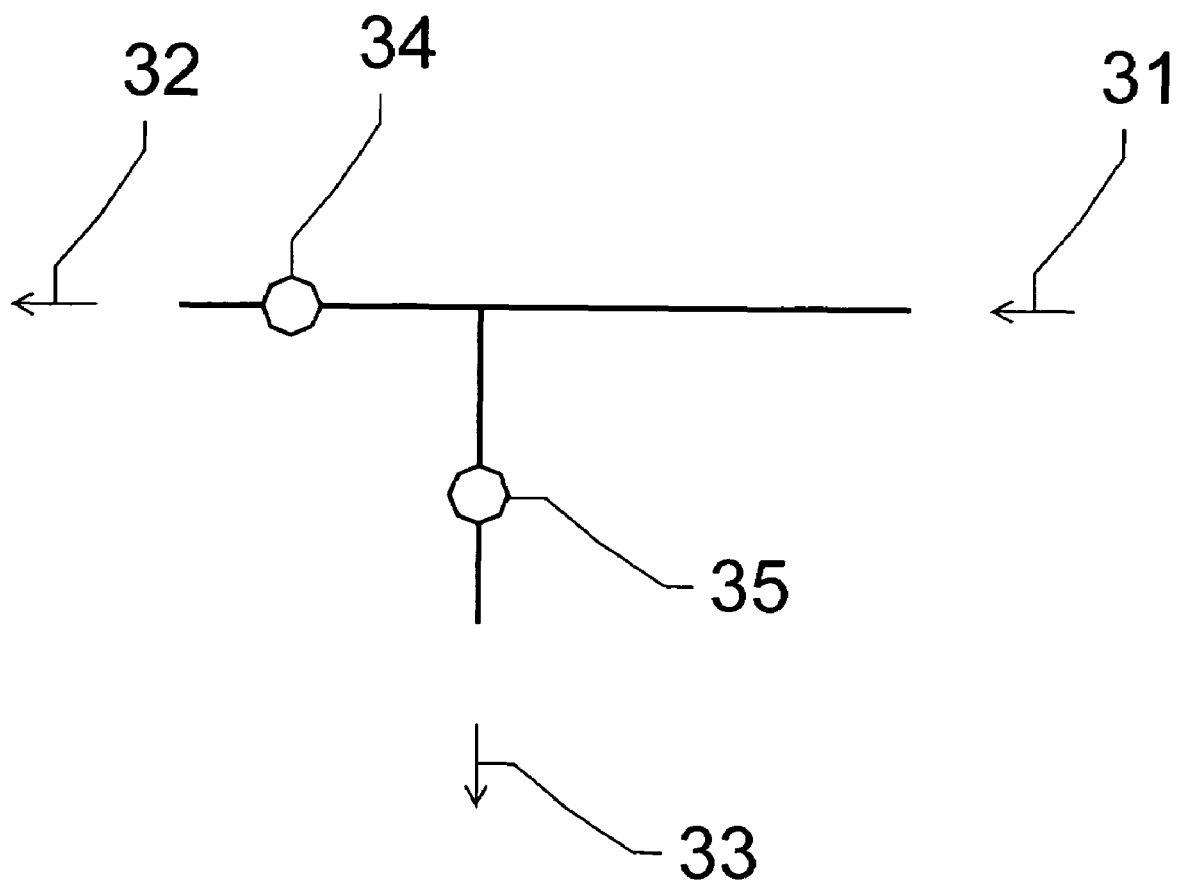
FIG. 3 shows the pulsing manifold of precursor source.

FIG. 3 shows the pulsing manifold of the precursor source. Precursor inlet is 31. Chamber inlet is 32 and vacuum pump exhaust is 33. By switching the valves 34 and 35, the precursor flow 31 can be effectively pulsed. When valve 34 is opened and is valve 35 closed the precursor flows into the chamber. When valve 34 is closed and valve 35 is opened, the precursor flows to the exhaust. This pulsing manifold allows fast switching of the precursor flow without the need for gas flow stabilization.

FIG. 4 shows the characteristic table of step (a) and step (b) of the present invention method of deposition. The first precursor gas 1 is controlled by the plasma position. When the plasma is on, gas 1 is excited. When the plasma is off, gas 1 is not excited. The second precursor gas 2 is always not excited by the plasma and the third precursor gas 3 is always excited by the plasma.

FIG. 5 shows the characteristic table of step (a), step (b), step (c) and step (d) of another embodiment the present invention method of deposition. Steps (a) and (b) are the same as in FIG. 4 which are, applicable when gas 1 is flowing. When gas 1 is not flowing, the ambient, which is composed of residual gas, is controlled by the plasma power. The ambient gas is excited by the plasma when the plasma is on. When gas 1 is flowing and the amount of plasma is on, the ambient gas is small compared to that of gas 1, thus its effect is negligible.

Figure 6:
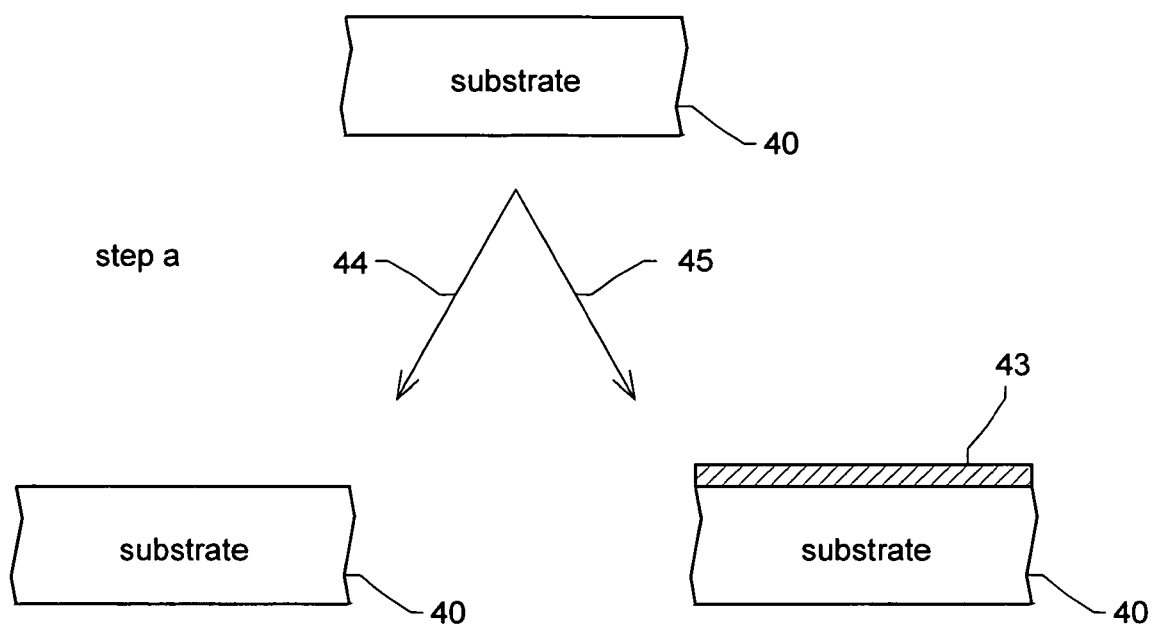

FIG. 6 shows the deposited layers of step (a): not-excited gas 1 flows. With certain temperatures, no film is deposited on the substrate 40 (path 44). With the right temperature, a layer 43 is deposited on the substrate 40 (path 45).

Figure 7:
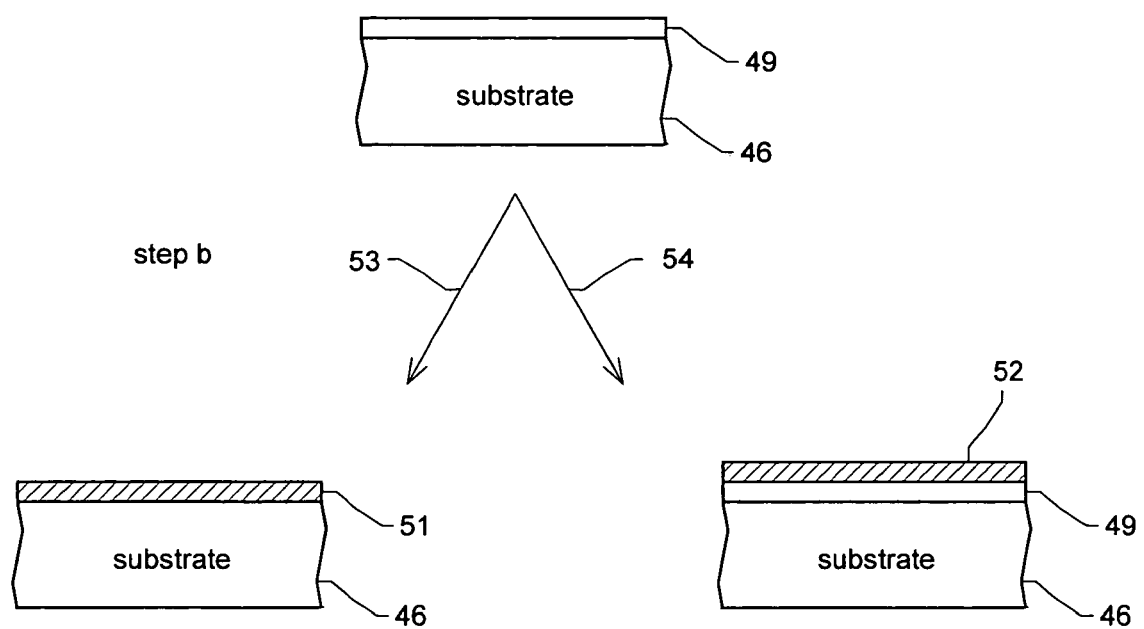
FIG. 7 shows the deposited layers of step b.

FIG. 7 shows the deposited layers of step (b): excited gas 1 flow. The excited gas 1 could react with the present layer 49 and convert layer 49 to another layer 51 that has different properties (path 53). The excited gas 1 could deposit a layer 52 on the existing layer 49 on top of the substrate 46 (path 54).

Figure 8:
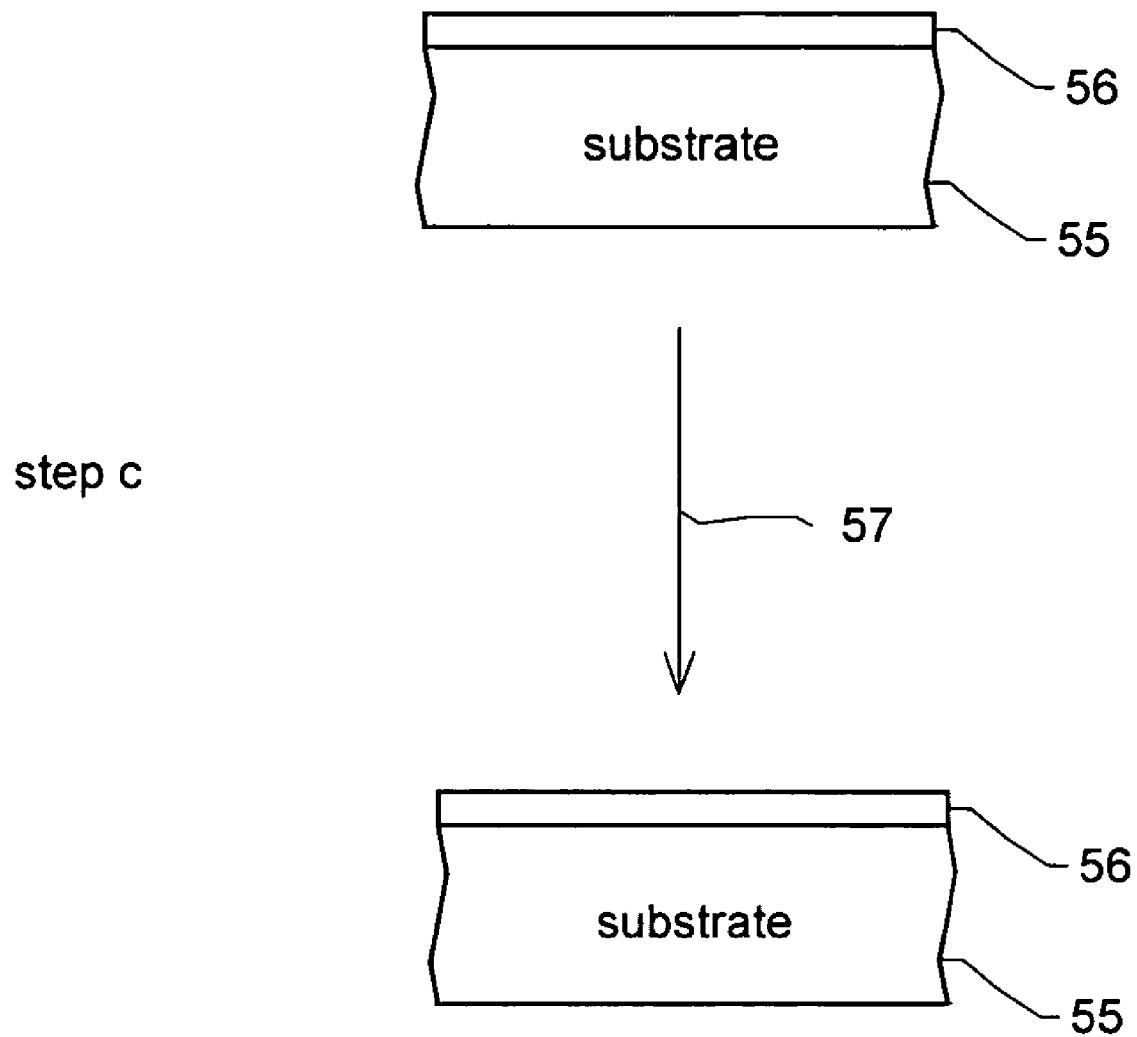
FIG. 8 shows the deposited layers of step c.

FIG. 8 shows the deposited layers of step (c): no gas 1 flow and no excited ambient. Nothing happens so that layer 56 on substrate 55 remains layer 56 on substrate 55 (path 57).

Figure 9:
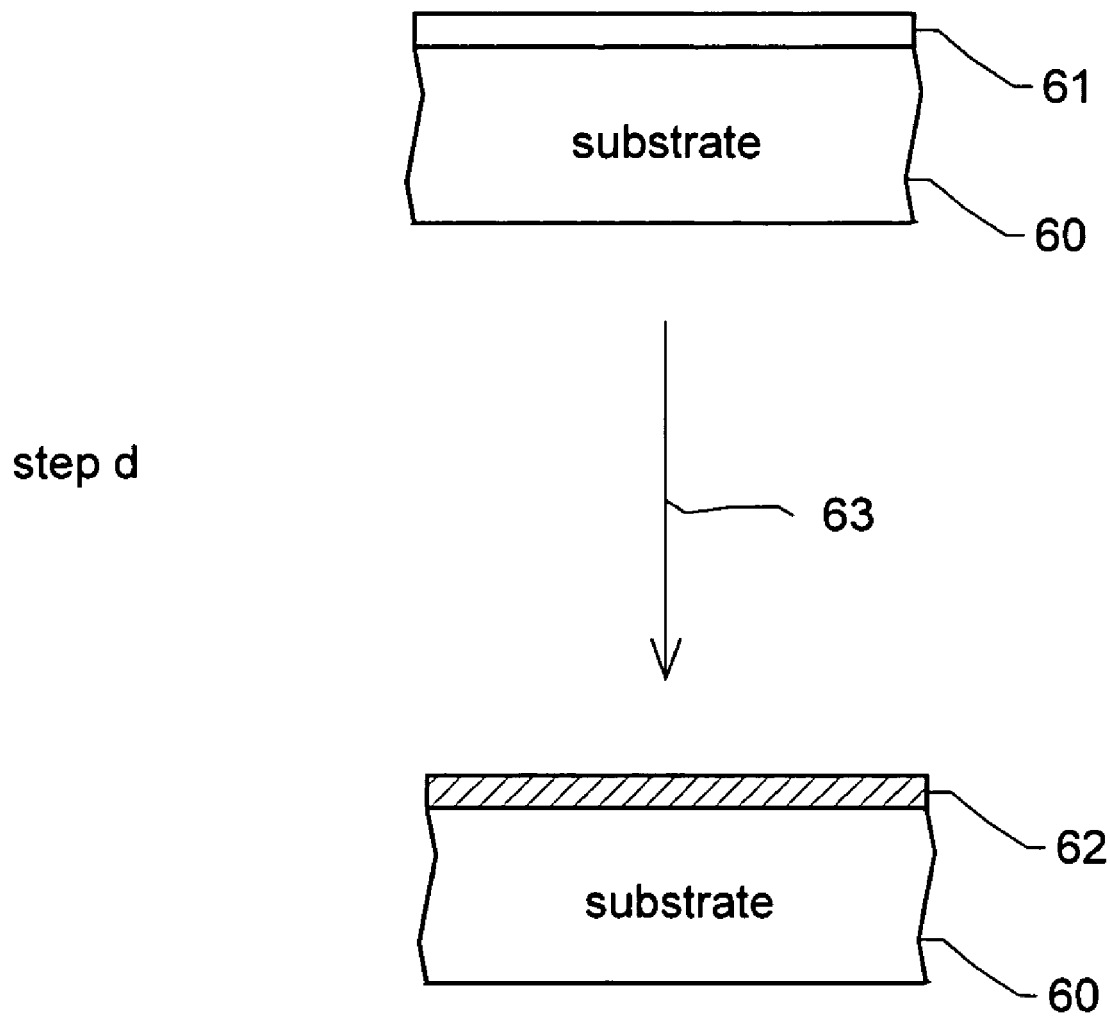
FIG. 9 shows the deposited layers of step d.

FIG. 9 shows the deposited layers of step (d): no gas 1 flow and the ambient is excited. The plasma excited ambient reacts with the layer 61 on substrate 60. Layer 61 undergoes reaction to become layer 62 that has different properties (path 63).

Figure 10:
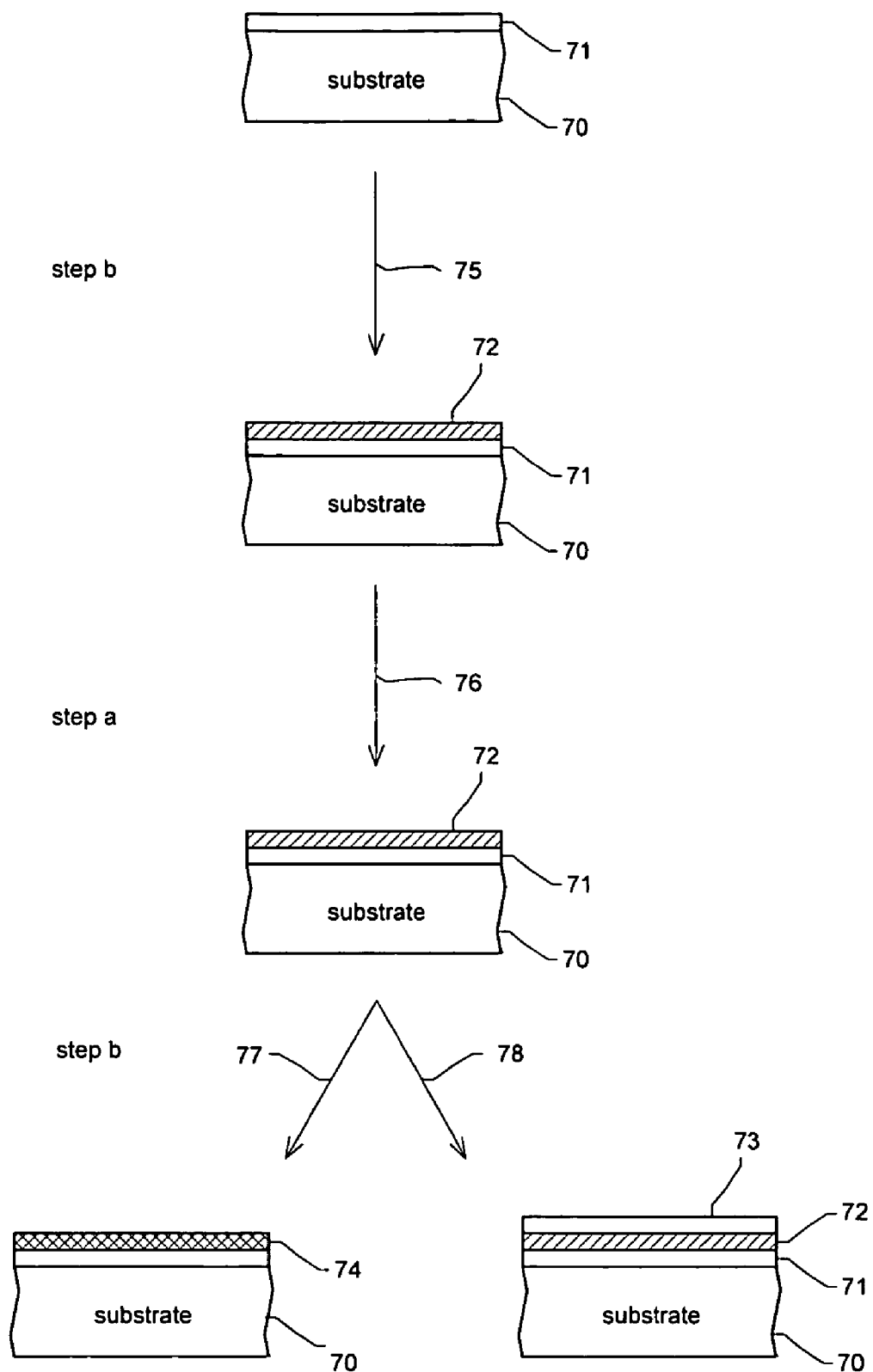
FIG. 10 shows the deposited layers of sequence b a b.

FIG. 10 shows the deposited layers of sequence b a b. The workpiece starts with layer 71 on substrate 70. After step (b) (path 75), a layer 72 is deposited on layer 71. The temperature is chosen such that no reaction occurs during step (a), thus nothing happens to the workpiece (path 76). After another step (b), layer 72 could undergo plasma reaction to become layer 74 that has different properties (path 77), or could a layer 73 can be deposited on layer 72 (path 78).

Figure 11:
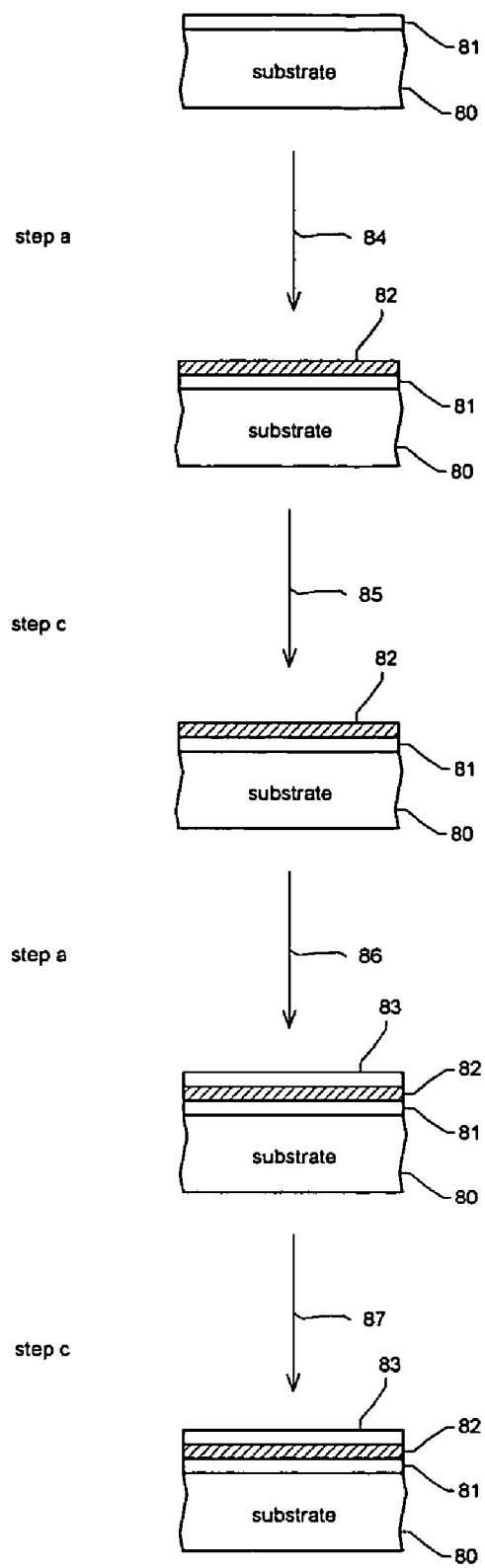
FIG. 11 shows the deposited layers of sequence a c a c.

FIG. 11 shows the deposited layers of sequence a c a c. The workpiece starts with layer 81 on substrate 80. After step (a), a layer 82 is deposited on layer 81 (path 84). Step (c) cleans out the off precursors, thus nothing happens to the workpiece (path 85). Another step (a) deposits layer 83 on layer 82 (path 86). Step (c) cleans out the off precursors, thus nothing happens to the workpiece (path 87).

Figure 12:
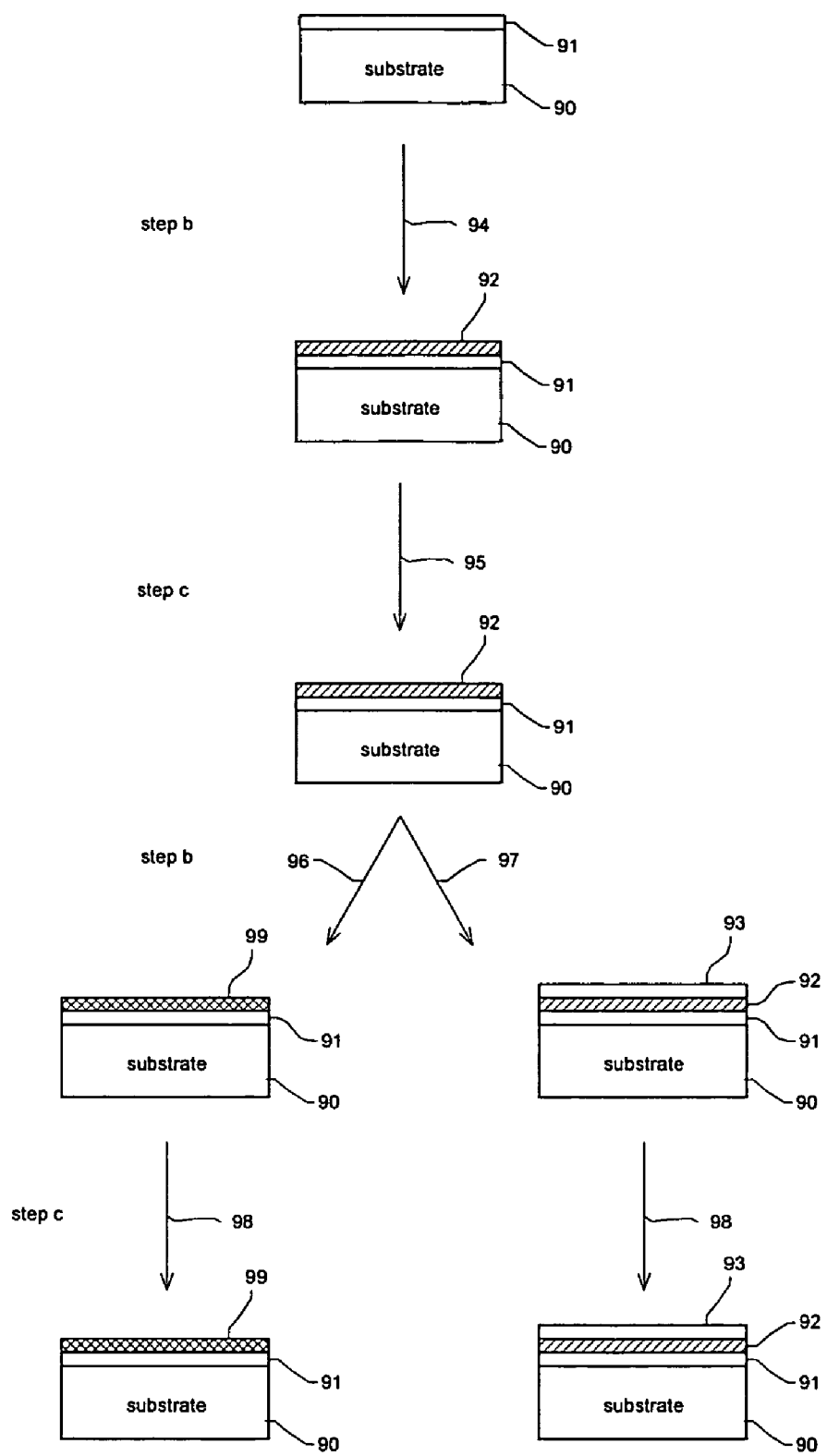
FIG. 12 shows the deposited layers of sequence b c b c.

FIG. 12 shows the deposited layers of sequence b c b c. The workpiece starts with layer 91 on substrate 90. After step (b), a layer 92 is deposited on layer 91 (path 94). Step (c) cleans out the off precursors, thus nothing happens to the workpiece (path 95). Another step (b) could promote a reaction with layer 92 to create layer 99 that has different properties (path 96) or could deposit layer 93 on layer 92 (path 97). Step (c) cleans out the off precursors, thus nothing happens to the workpiece (path 98).

Figure 13:
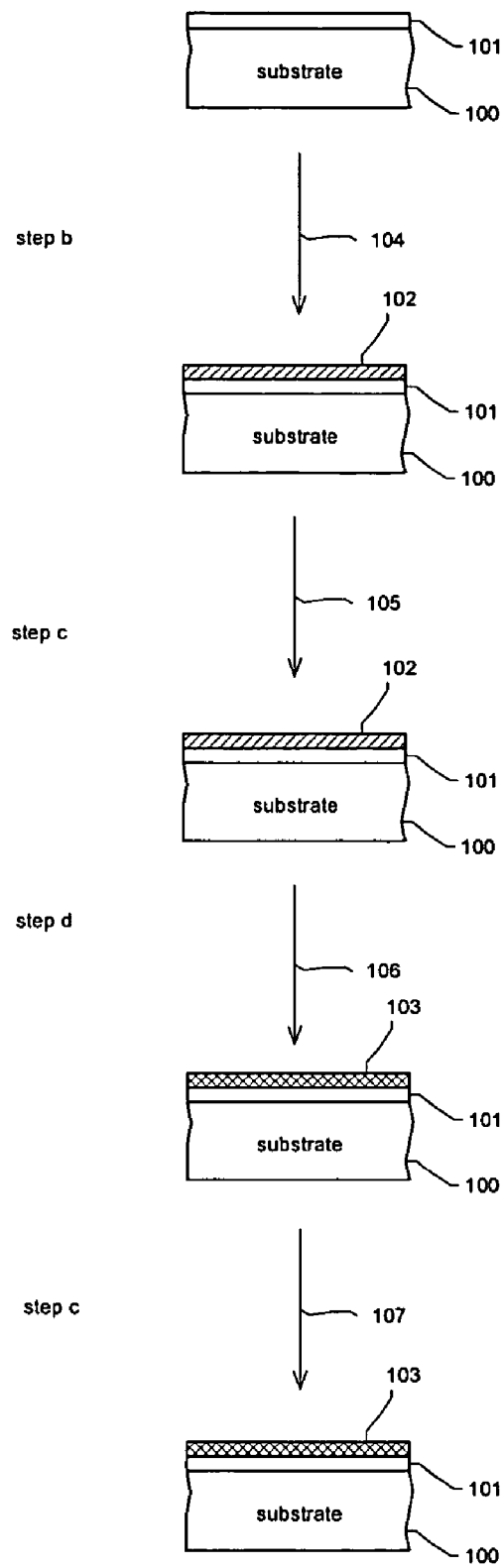
FIG. 13 shows the deposited layers of sequence b c d c.

FIG. 13 shows the deposited layers of sequence b c d c. The workpiece starts with layer 101 on substrate 100. After step (b), a layer 102 is deposited on layer 101 (path 104). Step (c) cleans out the off precursors, thus nothing happens to the workpiece (path 105). Step (d) promotes a reaction with layer 102 to create layer 103 that has different properties (path 106). Step (c) cleans out the off precursors, thus nothing happens to the workpiece (path 107).

Figure 14:
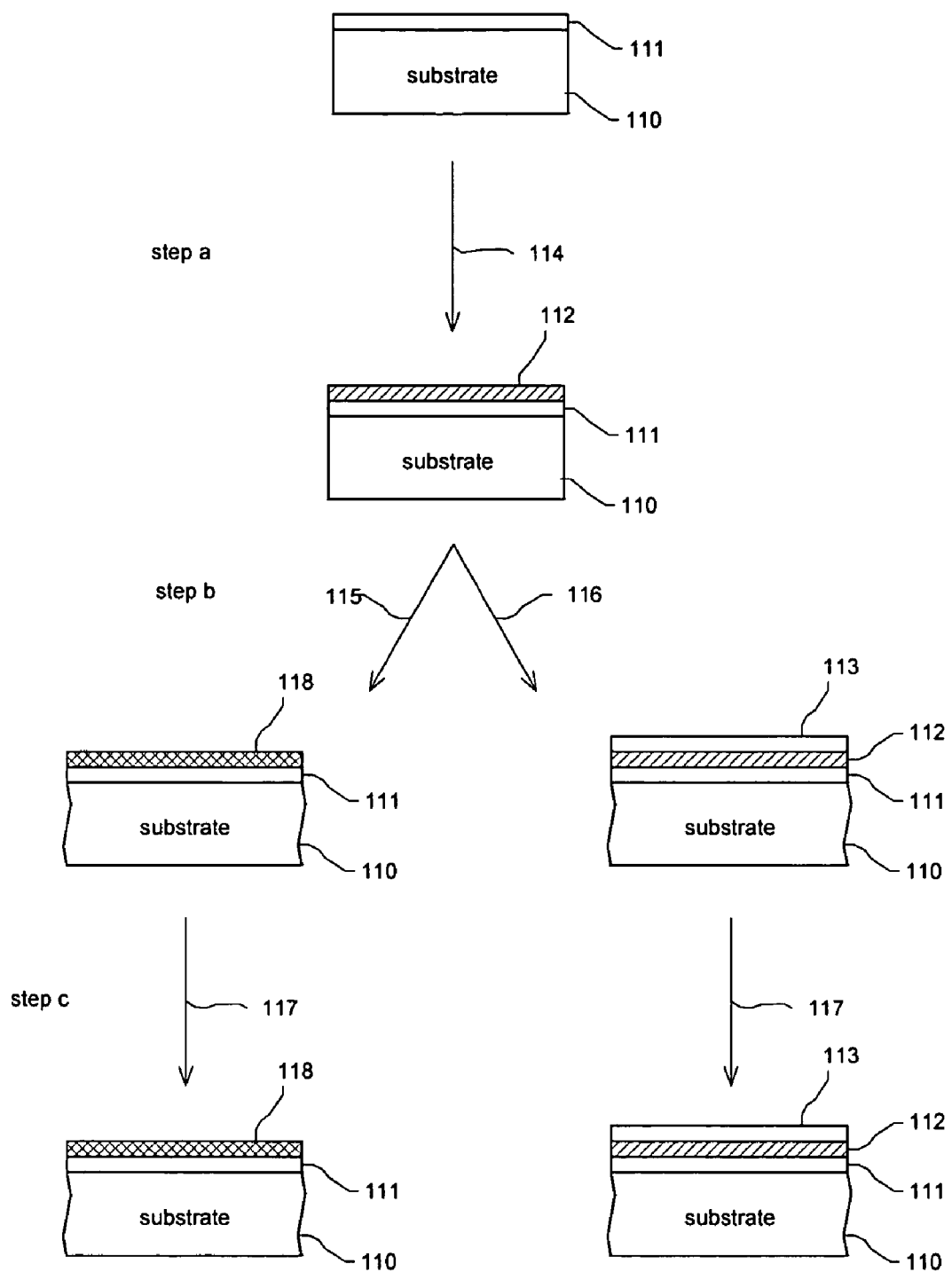
FIG. 14 shows the deposited layers of sequence a b c.

FIG. 14 shows the deposited layers of sequence a b c. The workpiece starts with layer 111 on substrate 110. After step (a), a layer 112 is deposited on layer 111 (path 114). A step (b) could promote a reaction with layer 112 to create layer 118 that has different properties (path 115) or could deposit layer 113 on layer 112 (path 116). Step (c) cleans out the off precursors, thus nothing happens to the workpiece (path 117).

Figure 15:
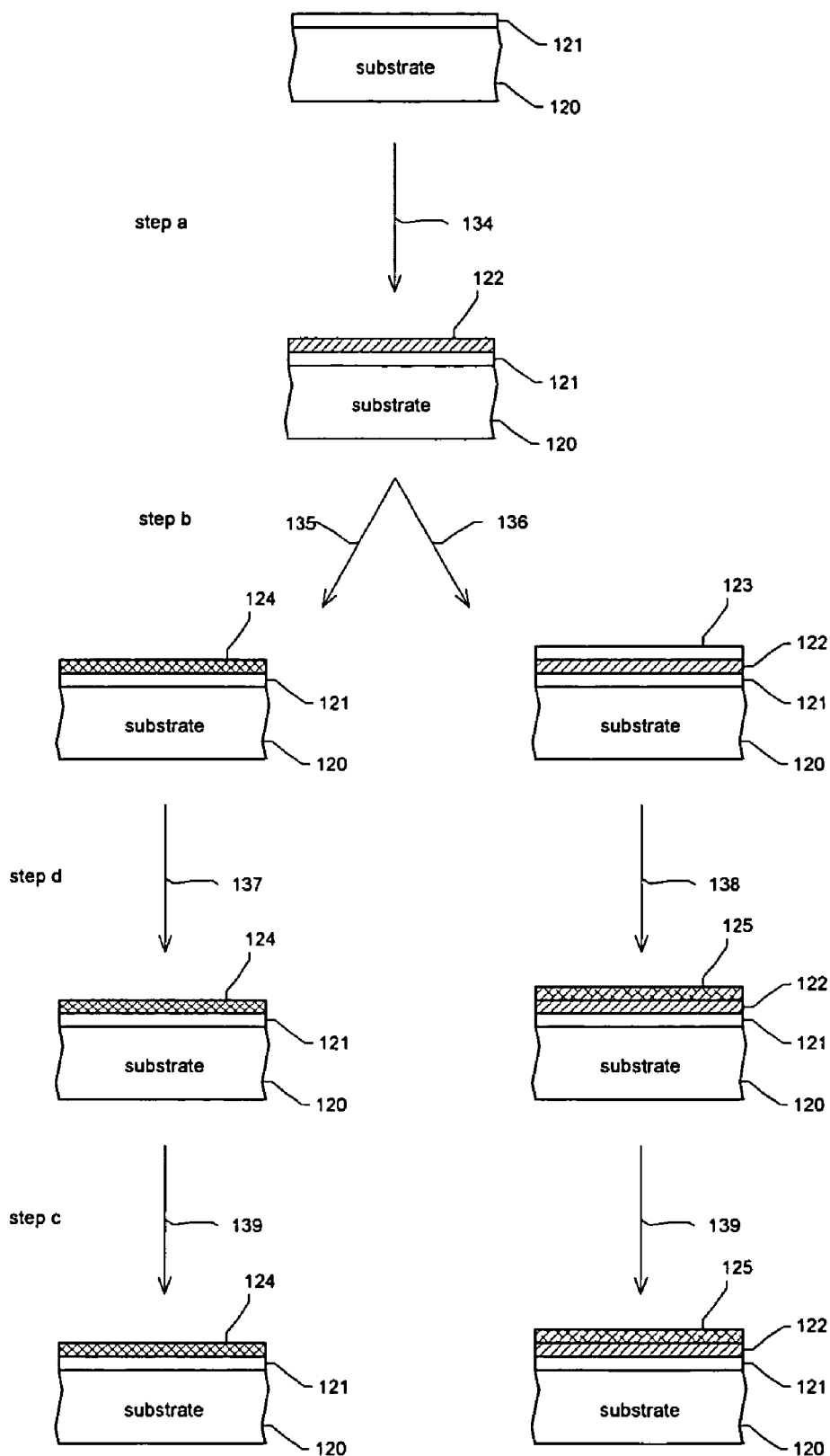
FIG. 15 shows the deposited layers of sequence a b d c.

FIG. 15 shows the deposited layers of sequence a b d c. The workpiece starts with layer 121 on substrate 120. After step (a), a layer 122 is deposited on layer 121 (path 134). A step (b) could promote a reaction with layer 122 to create layer 124 that has different properties (path 135) or could deposit layer 123 on layer 122 (path 136). Step (d) does not have an effect on layer 124 (path 137) or promotes a reaction with layer 123 to create layer 125 that has different properties (path 138). Step (c) cleaning out off precursors, thus nothing happens to the workpiece (path 139).

Although preferred embodiments of practicing the method of the invention have been disclosed, it will be appreciated that further modifications and variations thereto may be made while keeping within the scope of the invention as defined in the appended claims.

What is claimed is:

1. An atomic layer deposition method for forming a layer on a workpiece in a process chamber that includes:
   a precursor source coupled to the process chamber;
   an energy source coupled to the process chamber for generating a plasma therein; and
   a plasma adjusting system adapted to vary energy from the energy source in order to generate the plasma;

wherein the plasma adjusting system selectably adjusts a volume of the plasma by adjusting the energy that generates the plasma;

wherein the method comprises the steps of:
generating a plasma;
introducing a precursor to the process chamber from the precursor source such that the precursor is not excited by the plasma; and
increasing a volume of the plasma to excite the precursor, thereby causing the precursor to react with a surface of the workpiece to cause atomic layer deposition.

2. The atomic layer deposition method of claim 1 wherein the energy source is selected from a group consisting of an inductive coupled plasma (ICP) source, capacitance plasma source, microwave guide plasma source, electron cyclotron resonance (ECR) plasma source, magnetron plasma source, DC power plasma source.

3. The atomic layer deposition method of claim 1 wherein generating the plasma comprises applying 15 to 6000 watts of power to the energy source.

4. The atomic layer deposition method of claim 1, wherein the process chamber further includes a second precursor source coupled to the process chamber; and
the method further comprises introducing a second precursor to the process chamber from the second precursor source such that the second precursor is not excitable by the plasma; and
wherein the second precursor is introduced to the process chamber prior to increasing the volume of the plasma.

5. The atomic layer deposition method of claim 1, wherein the process chamber further includes a third precursor source coupled to the process chamber; and
the method further comprises:
introducing the third precursor to the process chamber from the third precursor source subsequent to turning on the plasma; and
wherein the plasma causes the third precursor to react with the surface to modify a previously deposited layer.

6. The atomic layer deposition method of claim 1, wherein the process chamber further includes an electrode controllable by a voltage source to increase or decrease the volume of the plasma.

7. The atomic layer deposition method of claim 1 wherein generating the plasma comprises applying 15 to 6000 watts of power to the energy source.

8. The atomic layer deposition method of claim 1, wherein the process chamber further includes a second precursor source coupled to the process chamber; and
the method further comprises introducing a second precursor to the process chamber from the second precursor source such that the second precursor is not excitable by the plasma; and
wherein the second precursor is introduced to the process chamber prior to pulsing the plasma.

9. The atomic layer deposition method of claim 1, wherein the process chamber further includes a third precursor source coupled to the process chamber; and
the method further comprises introducing the third precursor to the process chamber from the third precursor source subsequent to turning on the plasma; and
wherein the plasma causes the third precursor to react with the surface to modify a previously deposited layer.

10. The atomic layer deposition method of claim 1, wherein the process chamber further includes an electrode controllable by a voltage source to pulse the plasma.

11. An atomic layer deposition method for forming a layer on a workpiece in a process chamber that includes:
a precursor source coupled to the process chamber;
an energy source coupled to the process chamber to generate a plasma therein; and
a plasma adjusting system configured to control the energy source to vary energy from the energy source in order to generate the plasma;
wherein the plasma adjusting system pulses the plasma by increasing a volume of the plasma;
wherein the method comprises the steps of:
turning on the plasma;
introducing a precursor to the process chamber from the precursor source such that the precursor is not excited by the plasma, the unexcited precursor reacting with a surface of the workpiece to cause atomic layer deposition; and
pulsing the plasma to excite the precursor, thereby causing the precursor to modify a material formed on the surface during atomic layer deposition.

12. The atomic layer deposition method of claim 11 wherein the energy source is selected from a group consisting of an inductive coupled plasma (ICP) source, capacitance plasma source, microwave guide plasma source, electron cyclotron resonance (ECR) plasma source, magnetron plasma source, DC power plasma source.

* * * * *